(12) United States Patent
Killen, Jr. et al.

(10) Patent No.: US 12,256,515 B2
(45) Date of Patent: Mar. 18, 2025

(54) CABLE MANAGEMENT PERCH FOR USE WITH RACK RAIL-MOUNTED CHASSIS

(71) Applicant: SANMINA CORPORATION, San Jose, CA (US)

(72) Inventors: Odie Banks Killen, Jr., Colorado Springs, CO (US); John Albert Bauer, Jr., Colorado Springs, CO (US)

(73) Assignee: Sanmina Corporation, San Jose, CA (US)

( * ) Notice: Subject to any disclaimer, the term of this patent is extended or adjusted under 35 U.S.C. 154(b) by 153 days.

(21) Appl. No.: 17/981,007

(22) Filed: Nov. 4, 2022

(65) Prior Publication Data
US 2024/0155800 A1    May 9, 2024

(51) Int. Cl.
*H05K 7/14* (2006.01)
*F16L 3/06* (2006.01)

(52) U.S. Cl.
CPC .............. *H05K 7/1492* (2013.01); *F16L 3/06* (2013.01)

(58) Field of Classification Search
CPC ................................. H05K 7/1492; F16L 2/06
See application file for complete search history.

(56) References Cited

U.S. PATENT DOCUMENTS

| | | | | |
|---|---|---|---|---|
| 6,170,784 B1 * | 1/2001 | MacDonald | ......... | H05K 7/1448 248/65 |
| 6,396,992 B1 * | 5/2002 | Debal | ...................... | H04Q 1/06 385/134 |
| 6,679,722 B1 | 1/2004 | Pulizzi | | |
| 6,686,542 B2 | 2/2004 | Chan | | |
| 6,818,834 B1 | 11/2004 | Lin | | |
| 6,953,896 B2 | 10/2005 | Kleeberger et al. | | |
| 7,352,947 B2 * | 4/2008 | Phung | .................. | G02B 6/4459 248/65 |
| 7,510,421 B2 * | 3/2009 | Fransen | ................. | H04Q 1/021 439/449 |
| 9,429,251 B1 * | 8/2016 | Lin | ...................... | H02G 3/0456 |
| 10,340,674 B1 * | 7/2019 | Chompff | ................ | F16L 3/137 |
| 10,495,236 B1 * | 12/2019 | Lane | ......................... | H02G 3/32 |
| 2014/0001315 A1 * | 1/2014 | McNeal | ................... | H04Q 1/13 248/67.7 |
| 2017/0184224 A1 * | 6/2017 | Cheng | .................... | F16L 3/2235 |
| 2019/0027909 A1 * | 1/2019 | Mifsud | ............... | H02G 3/0406 |
| 2021/0392797 A1 | 12/2021 | Latuperissa | | |

FOREIGN PATENT DOCUMENTS

| | | |
|---|---|---|
| CN | 202615010 U | 12/2012 |
| CN | 205454335 U | 8/2016 |
| CN | 216451675 U | 5/2022 |

OTHER PUBLICATIONS

A'n D. "The Adjustable Depth "Zero U" Horizontal Rack Organizer." (C) 2015, downloaded from www.andcable.com, Aug. 5, 2022.
International Search Report and Written Opinion for International Patent Application No. PCT/US2023/035859, dated Jan. 17, 2024, 10 pages.

* cited by examiner

*Primary Examiner* — Anita M King
(74) *Attorney, Agent, or Firm* — Daniel C. Mallery; LOZA & LOZA, LLP (57) ABSTRACT

According to an aspect a perch is provided comprising a bracket configured to be attached to a rack-mount component, a bar having a width and an elongated surface, the bar having tabs configured to engage with the bracket, and an attachment screw to secure the bar to the bracket so that the bar extends horizontally across a portion of the component.

22 Claims, 11 Drawing Sheets

CABLE MANAGEMENT PERCH FOR USE WITH RACK RAIL-MOUNTED CHASSIS

FIELD

The present description relates to equipment in rack rail-mounted chassis systems and in particular to cable management for use in such systems.

BACKGROUND

Rack-mount electronics are used for data storage, data servers, data processing, communications, audio and video processing, and other applications. A typical installation will have rows of vertical four-post racks with rails running from side-to-side and front to rear between the four posts of each rack. Static rails are fixed in place and are typically bolted to the vertical posts. Sliding rails have one part that bolts to the vertical rack and another part that glides forward or back for access. Components mount to the rails one on top of the other and are arranged with ports and connectors on the back side and status displays and controls on the front side, although there may be a few ports and connectors on the front side and status indicators on the rear for quick access. The ports and connectors allow the components to be coupled together with cabling for data, power, interface, and communications.

The back side cabling allows the cables to be disconnected and connected from all of the components at the back side of the rack for replacement, service or reconfiguration. The cables are connected with service loops to allow components to move without straining the attached cables. Cable management arms are attached to the racks to allow the cabling to be organized and labeled for convenient servicing.

BRIEF SUMMARY OF SOME EXAMPLES

The following presents a summary of one or more aspects of the present disclosure, in order to provide a basic understanding of such aspects. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in a form as a prelude to the more detailed description that is presented later.

According to an aspect a perch is provided comprising a bar having a width and an elongated surface, the elongated surface having two opposite ends, and an arm attached to the bar at each end of the bar, the arms being configured to attach to a rack-mount component so that the bar extends horizontally across a portion of the component with a gap between the bar and a closest face of the component. A side wall may be positioned, coupled, or configured at each end of the bar substantially orthogonal to the bar, wherein the arms each attach to a respective side wall. The side wall may be formed as a bend in the bar. The arm may be positioned, coupled, or configured to attach to a bracket attached to the component. The bracket may be attached to the component by being attached to a canister that is attached to the component. Guides may be positioned, coupled, or configured to slide onto the bracket to secure the arm with respect to the bracket.

The arm may comprise spring-loaded tabs to releasably secure the arm against the bracket. The bar elongated surface may be substantially flat and configured to support cables lying on the bar. A cable lance may be formed in the bar. A cable lance may be attached to the bar. An end wall may be attached to the bar at an angle to the bar, the end wall configured to contain a cable between the end wall and the component. A cable lance may be formed in the end wall.

According to another aspect a perch is provided comprising a bracket configured to be attached to a rack-mount component, a bar having a width and an elongated surface, the bar having tabs configured to engage with the bracket, and an attachment screw to secure the bar to the bracket so that the bar extends horizontally across a portion of the component.

The bracket may be positioned, coupled, or configured with a first bottom mount configured to be held to the canister with a bottom mount screw and a rear mount configured to be held to the canister with a rear mount screw. The bracket may have cable lances to receive the tabs and a support plate to support the perch when the perch is installed on the bracket. The bar elongated surface may be substantially flat and configured to support cables lying on the bar. A cable lance may be positioned, coupled, or configured in the bar. A cable lance may be attached to the bar. An end wall may be attached to the bar at an angle to the bar, the end wall configured to contain a cable between the end wall and the component. A cable lance may be formed in the end wall.

According to another aspect, a perch is provided comprising a bracket configured to be attached to a rack-mount component, a bar having a width and an elongated surface, the bar having tabs configured to be secured by the bracket, and cable lances configured to retain cables from the component to the bar. The bar may have an elongated surface that is configured to support cables lying on the bar.

DETAILED DESCRIPTION OF THE INVENTION

The word "exemplary" or "embodiment" is used herein to mean "serving as an example, instance, or illustration." Any implementation or aspect described herein as "exemplary" or as an "embodiment" is not necessarily to be construed as preferred or advantageous over other aspects of the disclosure. Likewise, the term "aspects" does not require that all aspects of the disclosure include the discussed feature, advantage, or mode of operation.

Embodiments will now be described in detail with reference to the accompanying drawings. In the following description, numerous specific details are set forth in order to provide a thorough understanding of the aspects described herein. It will be apparent, however, to one skilled in the art, that these and other aspects may be practiced without some or all of these specific details. In addition, well known steps in a method of a process may be omitted from flow diagrams presented herein in order not to obscure the aspects of the disclosure. Similarly, well known components in a device may be omitted from figures and descriptions thereof presented herein in order not to obscure the aspects of the disclosure.

In the following detailed description, numerous specific details are set forth in order to provide a thorough understanding of the different aspects. However, it will be understood by one of ordinary skill in the art that the different aspects may be practiced without these specific details. For example, well-known operations, structures, and techniques may not be shown in detail in order not to obscure the different aspects presented herein.

As described herein, a small static cable management perch is attached to a rack mount component, for example, a controller. The perch provides a location to attach cables, attach adequate service loops, and attach strain relief clamps. The perch attaches to either the chassis of the component itself, or the canister that carries the component. The perch extends across the entire width of the component or may be broken into smaller sections, allowing a single perch to be used for a single connection site, for example an add-in card site. In some embodiments, the perch attaches in a tool-less manner using finger screws and snap-in attachments. Using multiple smaller perches allows the cable management to be optimized based on the number and type of add in cards installed. It also makes the cable management solution independent of the chassis height and number of installed controllers or add in cards.

The perches provide adequate support for cables lying on the perch with fastening points for the cables. Even in a static rail-mounted chassis, service actions are performed that require proper service loops in the cables to allow FRUs (Field Replaceable Units) to be removed and replaced. The perches also provide a place for cables to be dressed and routed in a manner that eliminates cable strain and provides proper strain relief. The features of the perch may be selected for each application and perches may be added or removed without affecting the rack or other components. The perch also simplifies removing and replacing the component when the cables are no longer routed and attached to the rack but only to the respective perch. Using perches, cables need not be attached directly to the rack as is commonly done. As a result, when a component is moved to a different position on the rack or to another rack, the cables do not need to be disconnected from the rack. For some moves, the cables may remain attached to the perches.

In the present description, a perch may be considered to refer to a seat, CMA (Cable Management Arm), pad, prop, or bar that serves as a resting or attachment place. The bar is particularly suited to support cables lying on the bar and attached to the bar. A lance or cable lance may be considered to refer to a loop through which a strap, tie, or wire may be threaded to secure the strap, tie, or wire in place. While lances are described and shown they are not required for all uses. In addition, any of a variety of other cable attachment structures may be substituted for or added to the lances described herein. While the present description is presented in the context of vertical four-post racks commonly used in server, data center, and audio installations, the perches described herein may also be applied to components in two-post racks commonly used for telephony and communications equipment.

Figure 1:
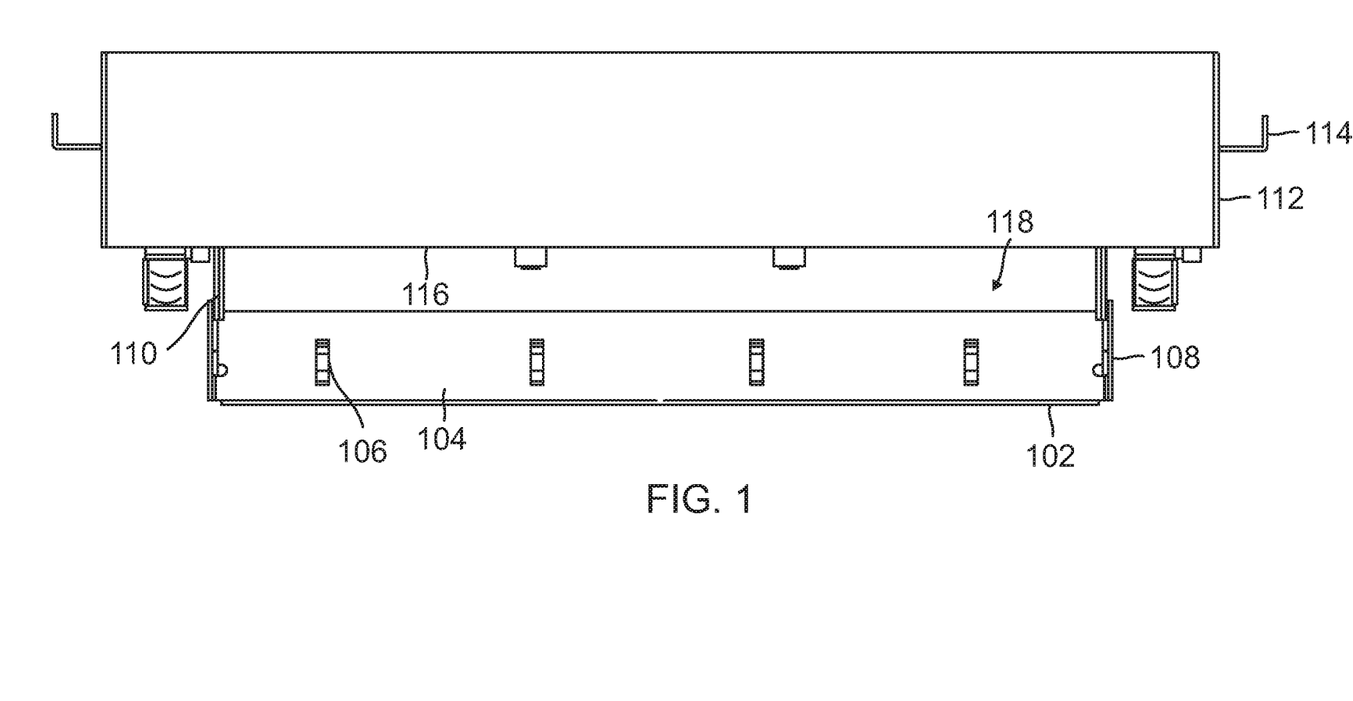
FIG. 1 is a top plan view of a single bar full-width perch attached to a component within a canister.

FIG. 1 is a top plan view of a single bar full-width perch attached to a rack-mount component within a canister. The perch 102 has a bar 104 with a width and an elongated surface that extends across most of the width of the component 116. Alternatively, the bar may extend horizontally across a portion of the component. The portion of the component may be a larger or smaller portion to suit different uses. The bar has an elongated surface that is horizontal and substantially flat to support cables lying on the bar. The bar provides a resting place for cables (not shown) that are connected to the component 116. A plurality of cable lances 106 are placed across the bar. In this example four cable lances 106 are spaced evenly across the bar 104 of the perch 102. The cable lances 106 provide an attachment point for cable ties and other objects to the perch 102. The perch has a sidewall 108 at each end of the bar 104. An arm 110 is attached to each sidewall 108. The arm attaches to the component 116. The component 116 is contained within a canister 112 that has ears 114 to attach to rack rails or a rack (not shown). While the component 116 is shown as being attached to a canister 112 for purposes of mounting to the rack. The canister is not required. A shelf or tray may be used instead, or the component 116 may be mounted to the rack or to rack rails directly.

A gap 118 is provided between the component 116 and the bar 104 of the perch 102. In other words, the perch is displaced by the arms 110 from the back of the component 116. The gap provides easier access to the back of the component. The gap also moves the bar 104 away from ports and connectors for cables on the back of the component 116 which is the closest face to the bar 104. Cables typically have a minimum bend radius limit to prevent harm to the operation of the cable through expected temperatures. Cable connectors may also have maximum transverse strain limits to prevent harm to the operation of the connector. The gap 118 and the width of the bar 104 support any cable against bending. The cable lances 106 allow cables to be secured to prevent the application of a transverse strain, for example by pulling a cable to the side.

The bend limit and transverse strain specifications may be different for different types of cables and connectors. For example, Ethernet cable typically allows for a smaller bend radius than InfiniBand cable. Accordingly, a network hub or router that connects Ethernet nodes using Ethernet cable may have a perch with a shallower bar and a shallower gap then a controller that exchanges high speed data with InfiniBand cables. In one example, a perch for Ethernet has a bar that is 3 cm to 4 cm wide and positioned 3 cm to 4 cm from the connectors on the back of the component. A perch for InfiniBand or video cable may have a perch with a bar that is 7 cm to 11 cm wide positioned with a gap of 7 cm to 11 cm.

Figure 2:
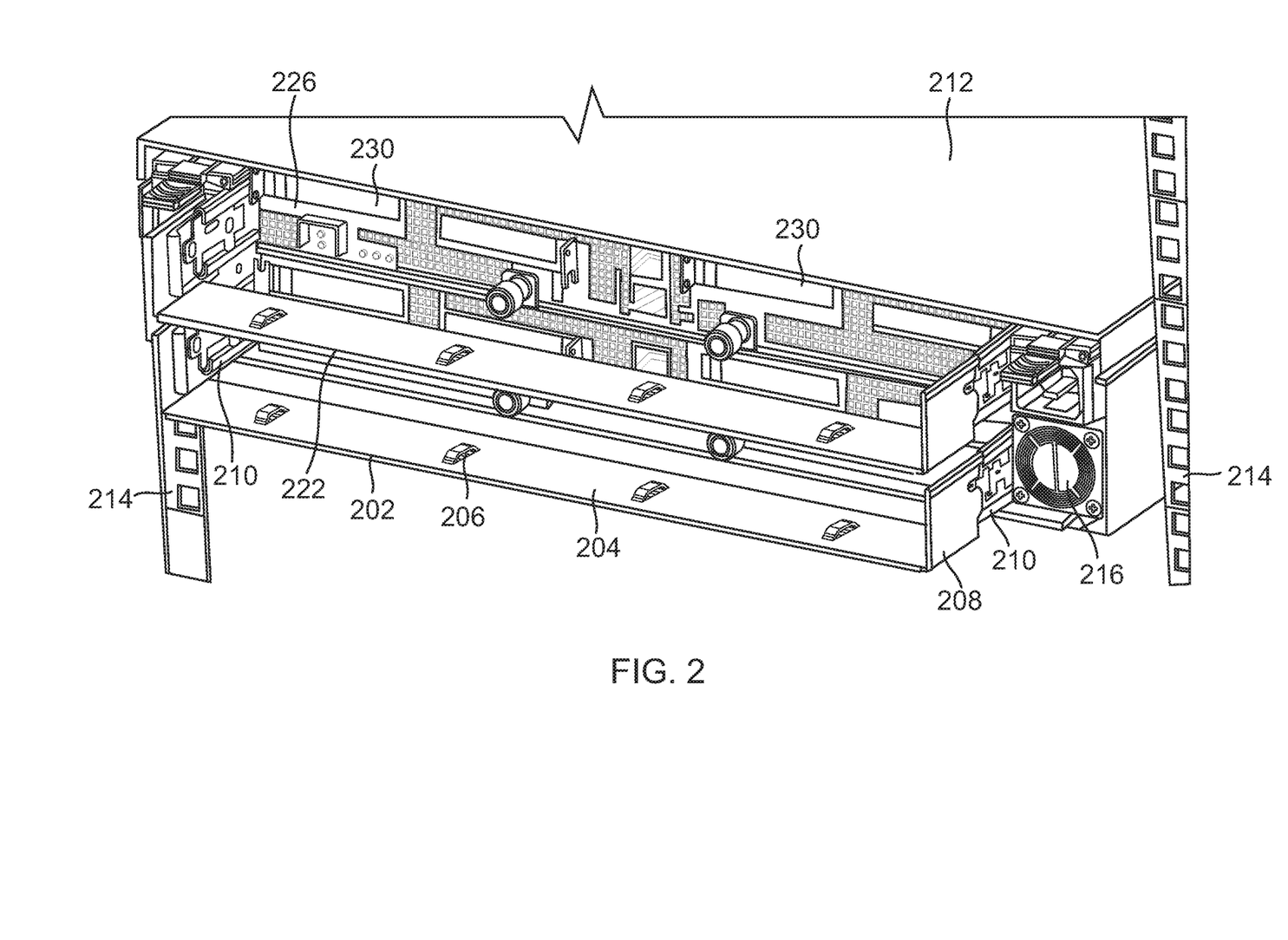
FIG. 2 is a rear isometric view of two single bar full-width perches attached to components within a canister.

FIG. 2 is a rear isometric view of two single bar full-width perches attached to rack-mount components within a canister. There is an upper perch 222 and a lower perch 202. The lower perch 202 has a bar 204 that extends across the width of a lower component 216. The bar provides a resting place for cables (not shown) that are connected to the lower component 216 and cable lances 206 are placed across the bar. The cable lances 206 may be formed by punching an arc through the bar and bending the metal of the bar to form a closed loop. Alternatively, the cable lances 206 may be a separate structure that is attached to the bar. The perch has a sidewall 208 at each end of the bar 204. An arm 210 is attached to each sidewall 208. The arm attaches to the lower component 216. The lower component 216 is contained within a canister 212 that has ears 214 to attach to a rack (not shown). The upper perch 222 is similar in size and structure and is attached to an upper component 226 that is attached within the same canister 212. However, different sizes and shapes of perches may be used on each component to suit different cables and cable routing.

As shown, the components 216, 226 in this implementation are single-height (1U) full-width stacked controllers. There is a single full width perch for each controller. The full-width perch may be used independent of the controller height or construction. Depending on the architecture, a controller may have slots 230 and bays to receive add-in cards and for data storage, processing, Input/Output (I/O) interfaces, and other purposes. Similarly, a storage component or hub may also have slots and bays. The slots and bays may be used to allow for FRUs, reconfiguration, and performance enhancements. Instead of attaching the perch directly to the component, a perch may instead be attached to a canister. A perch may be used for each add-in card or shared between multiple add in cards. The perch may be attached to a component using an additional bracket around the slot to permit the perch to be attached to the bracket.

Figure 3:
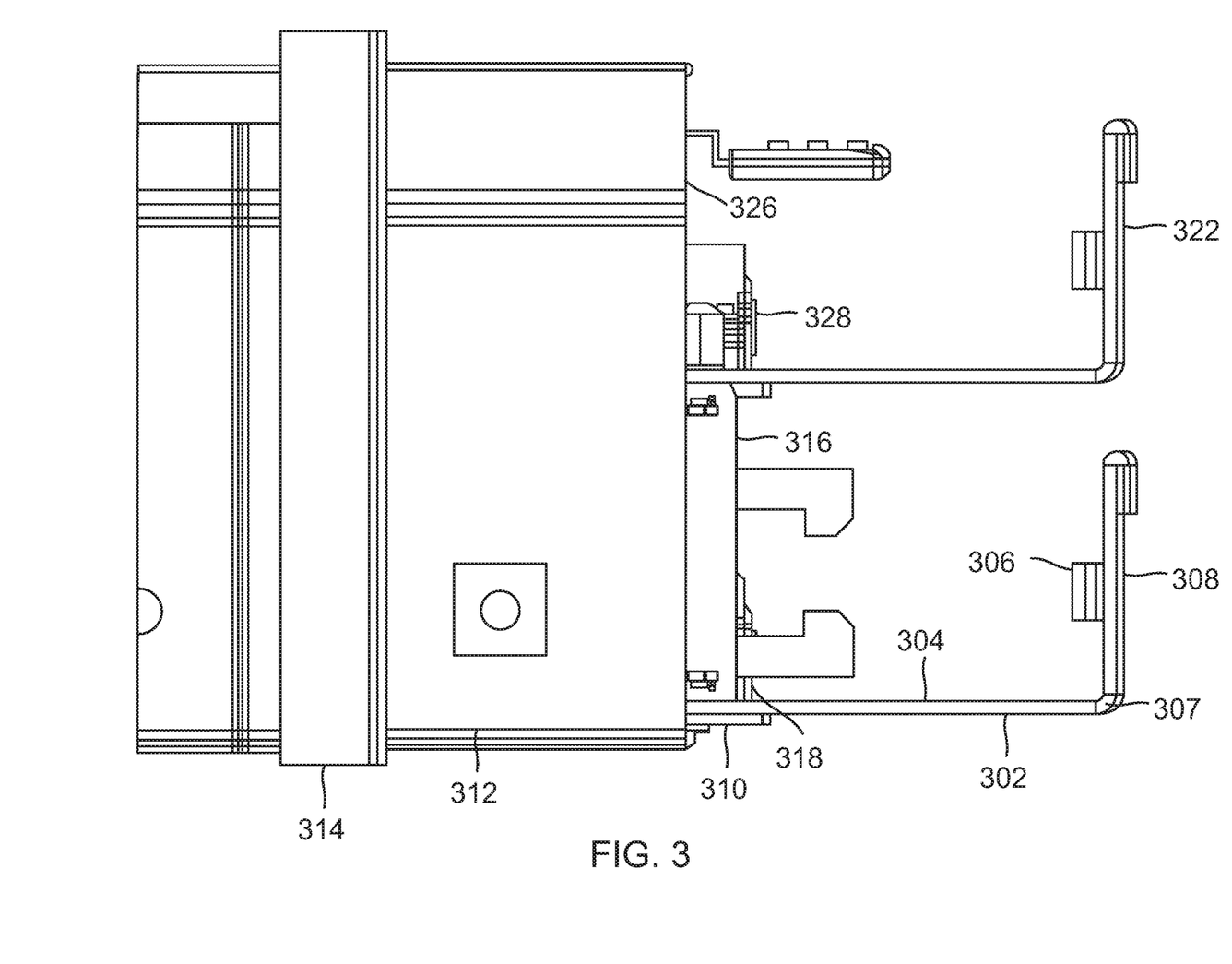
FIG. 3 is a side plan view of perches with back plates attached to support add-in card slots.

FIG. 3 is a side plan view of perches with back plates attached to support add-in card slots. A lower perch 302 is attached next to an add-in card slot 318 of a lower rack-mount component 316 and an upper perch 322 is attached next to an add-in card slot 328 of an upper rack-mount component 326. The two components are attached to a canister 312 that has rack-mount ears 314. The perches may have any desired width and extend horizontally across a portion of the component. The portion may be a full width portion or a lesser portion of the component, as shown. The bar of the perch may be any desired depth and gap from the respective component. The lower perch 302 has a bar 304 that extends across most of the width of two add-in card slots 318 which is only a portion of the component and a little less than half of the width of the component. The bar provides a resting place for cables (not shown) that are connected to the component 316. The bar 304 has a right-angle bend 307 to an end wall 308, such that the perch has a bar 304 and an end wall 308 with a right-angle bend 307 between the bar 304 and the end wall 308. A right-angle bend 307 is used as an example, the angle may be more or less than a right angle. The end wall 308 serves to protect the add-in card slots and to contain any cables between the end wall 308 and the component 316. Alternatively, instead of a bend, the end wall 308 may be a separate piece that is attached to the bar.

Cable lances 306 are placed across the end wall 308. Cable lances may additionally or alternatively be placed on the bar 304. The lower perch 302 has an arm 310 in the form of a short bar that is a little longer than twice the width of the bar 304 of the perch 302. The arm 310 is attached at one end to the bar 304 and at an opposite end to the component 316 or canister 312. The upper perch 322 is similar in size and structure and is attached next to the add-in card 328 of the upper component 326 in the same or a similar way. However, different sizes and shapes of perches may be used on each component to suit different cables and cable routing.

Figure 4:
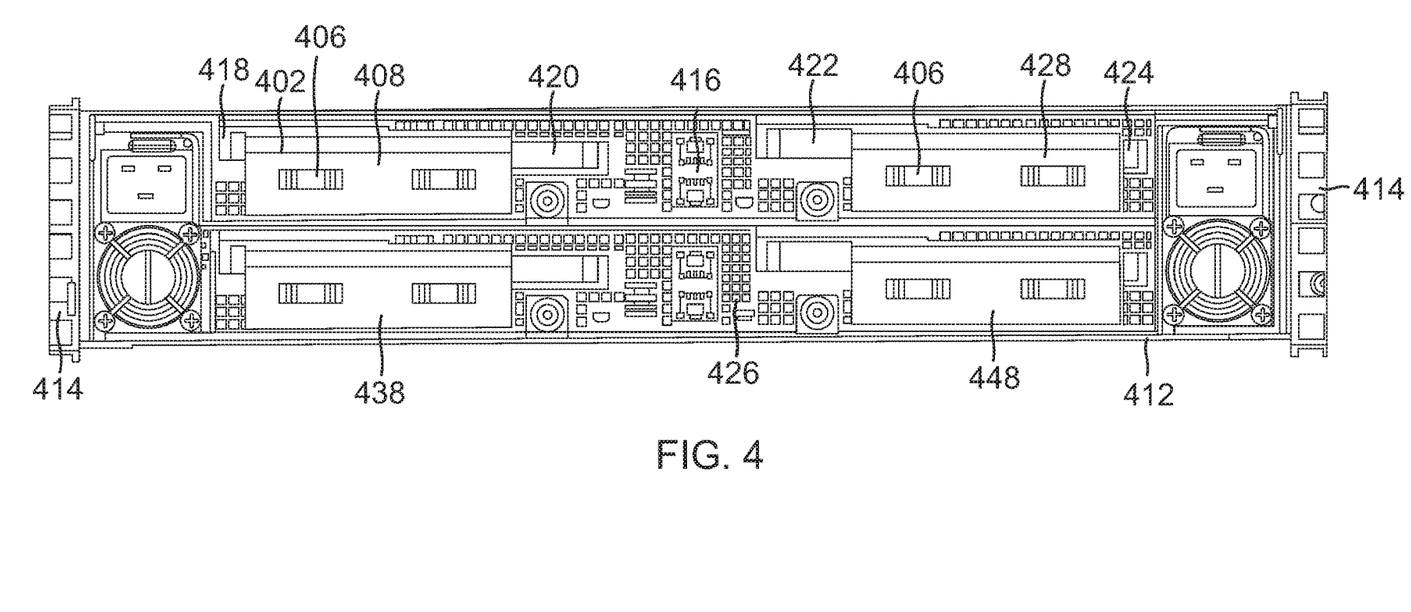
FIG. 4 is a rear plan view of perches attached next to add-in card slots of controllers that are mounted within a canister.

FIG. 4 is a rear plan view of perches attached next to add-in card slots of controllers that are mounted within a canister. An upper rack-mount controller 416 and a lower rack-mount controller 426 are installed into a canister 412 for rack mounting. The canister has rack ears 414 on each side and typically front and rear to attach to a rack. The upper controller 416 has four add-in card slots. There is a left side pair of add-in card slots 418, 420 and a right-side pair of add-in card slots 422, 424. In this example the slots are horizontally configured and positioned end-to-end in pairs as half-height PCIe (Peripheral Component Interconnect Express) slots, however, any other configuration may be supported. In some implementations, with a taller controller, for example double (2U) or triple (3U) height, the slots may be vertically configured and positioned side-by-side as half-height or full height slots.

A first upper perch 402 is attached next to the first pair of add-in card slots 418, 420. The first upper perch 402 is about two-thirds as wide as the pair of add-in card slots 418, 420, however, the first upper perch may be wider or narrower to suit the cables that are to be used and the positions of the connectors in each add-in card. Alternatively, there may be two perches, one for each add-in card slot. Only the end wall 408 of the first upper perch 402, and of the other perches, is visible in this view. The bar and any attachment fixtures or brackets are obscured. The end wall 408 includes two cable lances 406 to allow cables and other objects to be attached to the end wall 408. A second upper perch 428 is configured the same way but attached next to the right-side pair of add-in card slots 422, 424. In alternative embodiments, the two perches may have different shapes and sizes and may or may not include an end wall. Two lower perches 438, 448 are attached next to the add-in card slots of the lower controller 426 in the same way and may have the same or a different configuration to suit the cabling needs of the system. In some implementations, more or fewer perches are attached to the component or canister 412.

Figure 5:
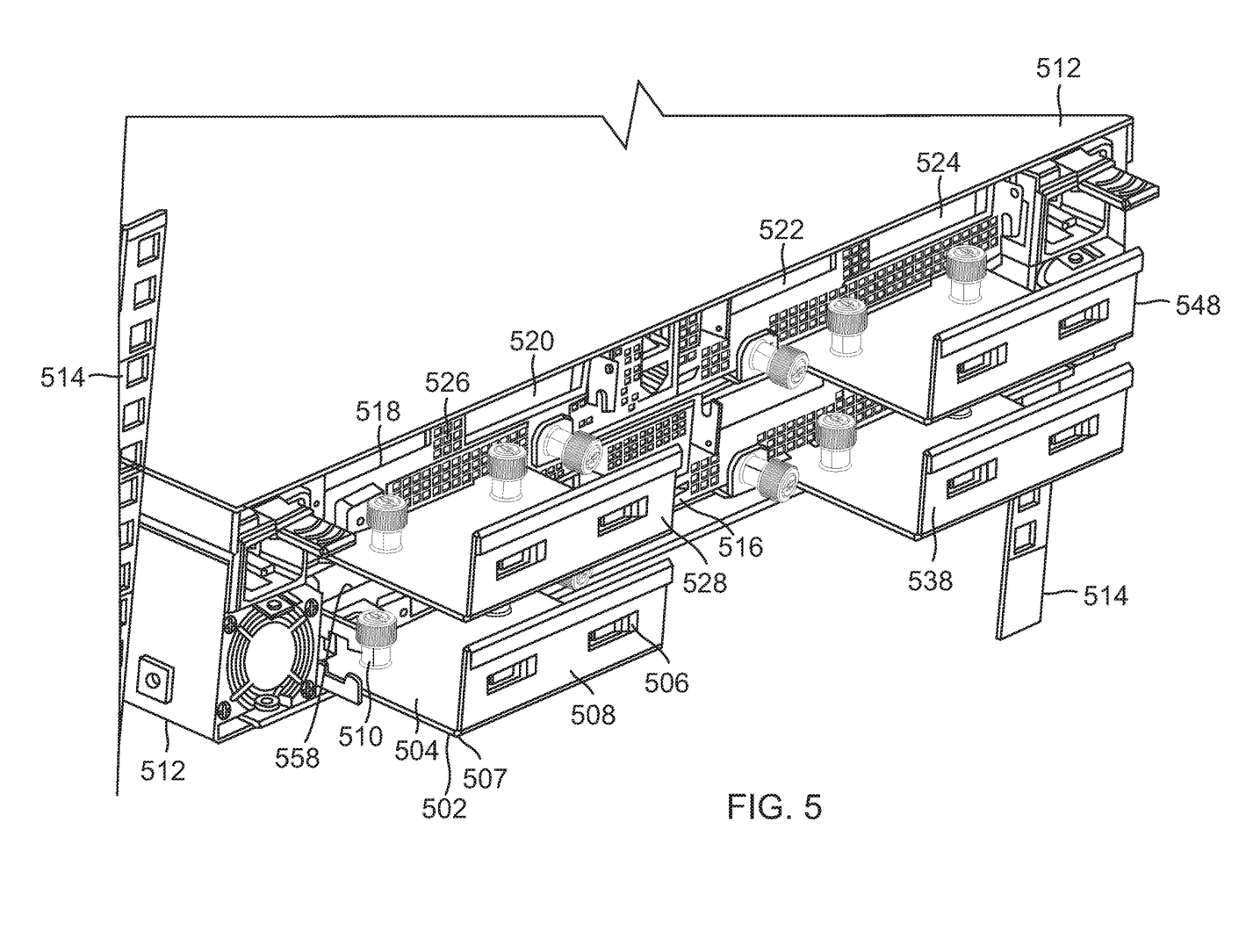
FIG. 5 is a rear isometric view of perches with back plates attached next to add-in card slots.

FIG. 5 is a rear isometric view of perches with back plates attached next to add-in card slots. A lower perch 502 is attached next to an add-in card slot 558 of a lower rack-mount component 516 and an upper perch 528 is attached next to an add-in card slot 518 of an upper rack-mount component 526. The two components are attached to a canister 512 that has rack-mount ears 514. The perches may have any desired width and any desired depth and gap from the respective component. The lower perch 502 has a bar 504 that extends across most of the width of two add-in card slots 558. The bar provides a resting place for cables (not shown) that are connected to the component 516 at an add-in card at the add-in card slot 558 or at other connectors of the component. The bar 504 has a right-angle bend 507 to an end wall 508, such that the perch has a bar 504 and an end wall 508 with a right-angle bend 507 between the bar 504 and the end wall 508. A right-angle bend 507 is used as an example, the angle may be more or less than a right angle. Cable lances 506 are formed in positions across the end wall 508. Cable lances may additionally or alternatively be placed on or formed in the bar 504. The lower perch 502 has screws 510 to attach the perch to a bracket (not shown). The screws 510 have a knurled end to allow for tool-less installation and removal from the bracket. The upper perch 528 is similar in size and structure and is attached to the add-in card slots 518, 520 of the upper component 526 in the same or a similar way. An additional lower perch 538 attaches to add-in card slots of the lower component 516 and an additional upper perch 548 attaches to add-in card slots 522, 524 of the upper component 526. Different sizes and shapes of perches may be used on each component to suit different cables and cable routing.

Figure 6:
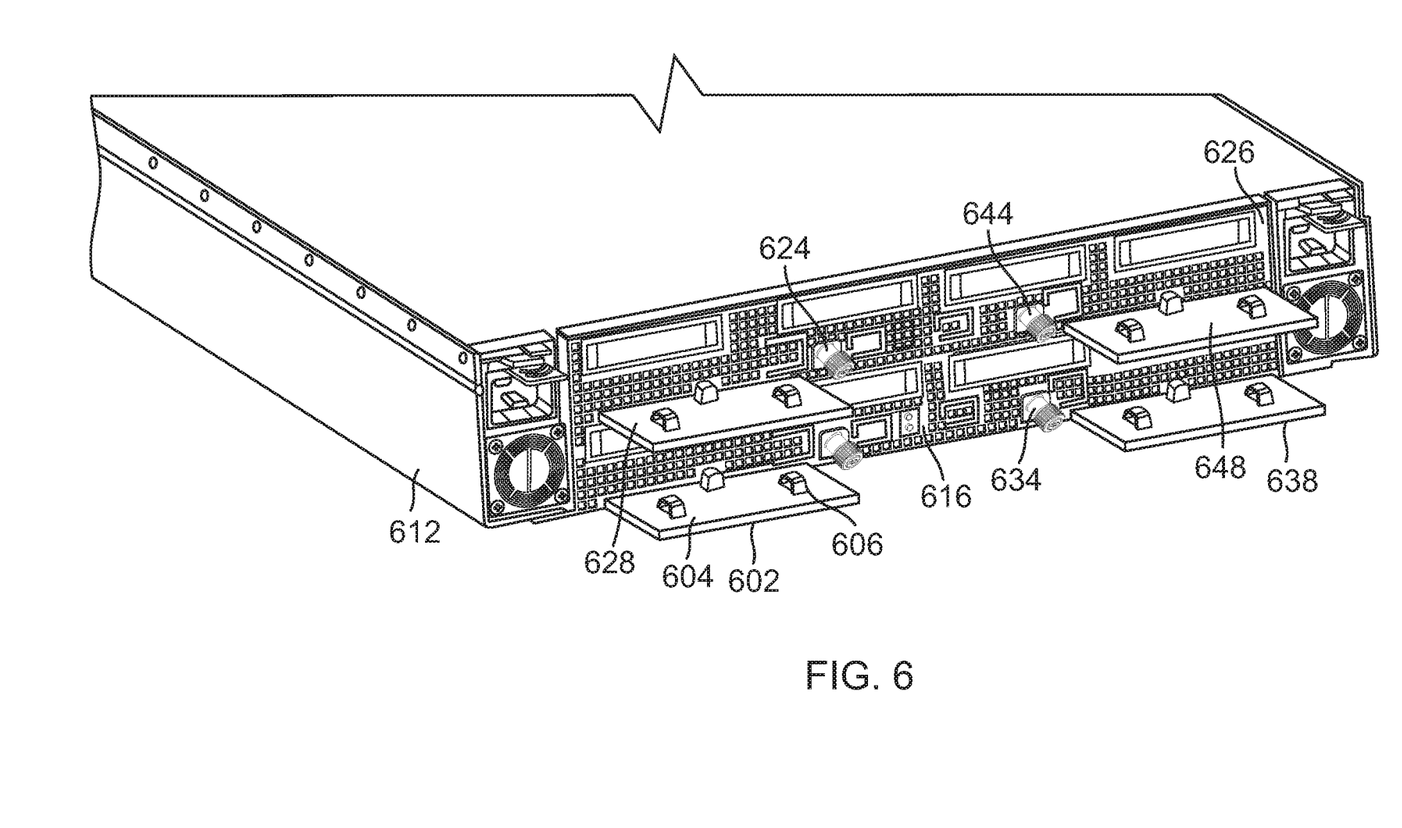
FIG. 6 is a rear isometric view of alternative perches attached next to add-in card slots.

FIG. 6 is a rear isometric view of alternative perches attached next to add-in card slots. A canister 612 supports and carries a lower controller 616 and an upper controller 626 each with four add-in card slots in each controller arranged end-to-end. A perch 602, 628, 638, 648 is attached next to each pair of add-in card slots of each controller. In this example the perches each have a flat bar 604 with cable lances 606. The flat bar extends horizontally across a portion of the component and is substantially flat to support cables (not shown) lying on the bar. As in the other examples, the bars are displaced by a fixed distance from connectors of the add-in card slots. The rear mount screws 624, 634, 644 to attach each perch to its respective controller 616, 626 are also visible in this view. As in the other examples, while the perches are all of the same type and form, any one or more of the perches may be modified to suit particular types of add-in cards and cables that may be used with a particular component.

In each of the examples illustrated above, the perches may be attached by hand (tool-less) and cable lances allow cables to also be attached without tools. The perches attach directly to the components or in the desired shape and strength. In some embodiments, the pieces are all cut and bent from sheet steel 2 mm to 5 mm thick that is then painted or powder-coated. Alternatively other metals, including aluminum, may be used or a variety of plastics. The perches may be formed from a combination of metals and plastics.

Figure 7:
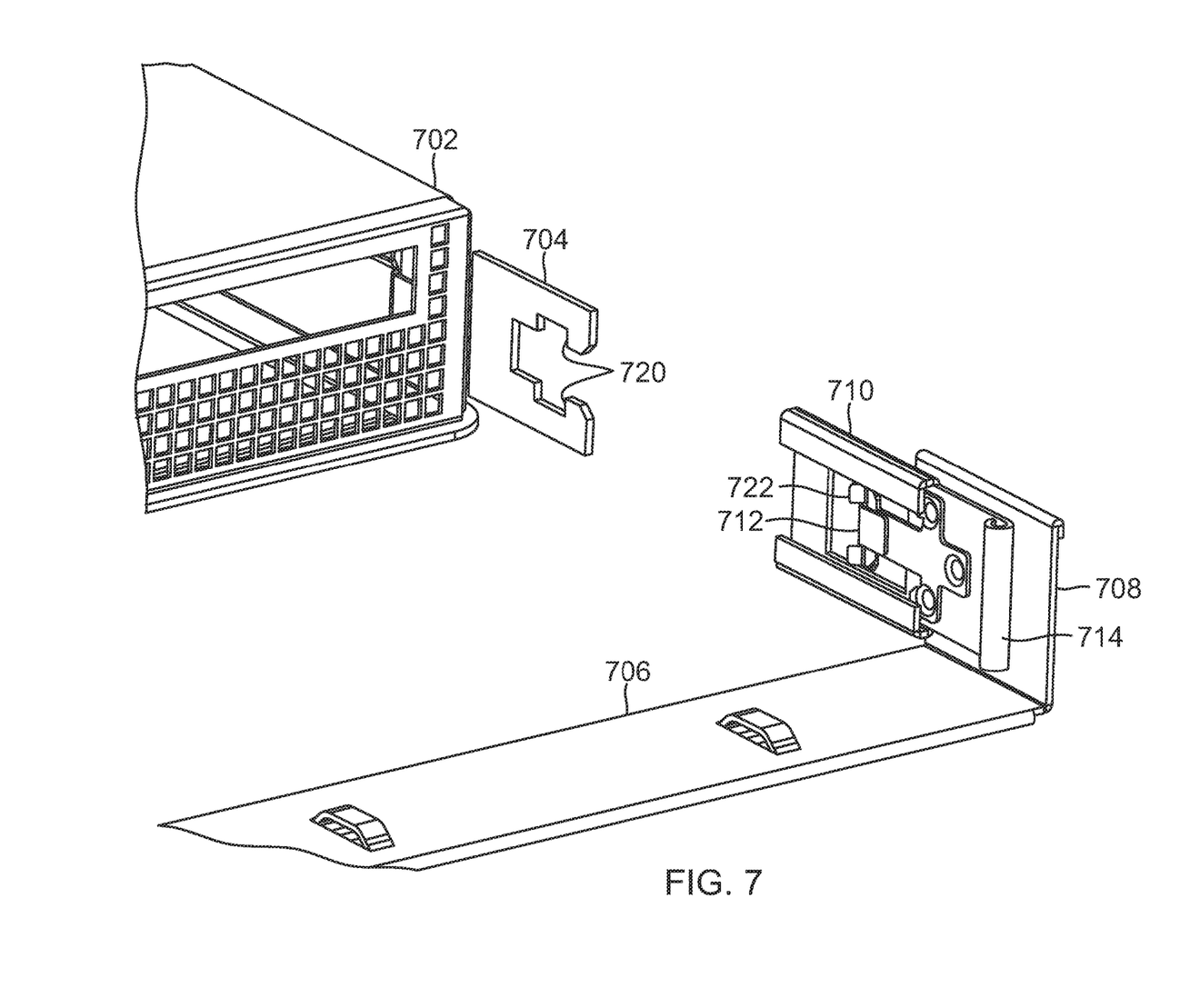
FIG. 7 is an exploded rear isometric view of one side of a full width perch that attaches to the edges of a canister.

FIG. 7 is an exploded rear isometric view of one side of a full width perch that attaches to the edges of a canister. The perch 706 may be any of the perches shown in FIGS. 1 and 2. The other perches shown herein may be adapted to be attached as shown. The perch 706 has a side wall 708. An arm 714 is attached to the side wall 708 to provide a connection to a bracket 704 of a canister 702. When a component is attached to the canister 702, then the bracket is attached to the component by being attached to the canister that is attached to the component. Alternatively, the bracket may be attached to a component instead of to the canister. The component may be rack mounted using the canister and ears, or with a shelf, a drawer, or in another way. The arm 714 includes a guide 710 to slide onto the bracket, a pair of tabs 722 and a leaf spring 712 connecting the tabs to the arm 714. The bracket 704 has a pair of prongs 720 to each engage a respective tab of the pair of tabs 722. The tabs are held in place against the prongs by the leaf spring 712 when the parts are assembled.

In the illustrated example, the guides 710 are in the form of upper and lower facing elongated slots that are configured to slide over the top and bottom surfaces of the bracket 704. The guides secure the arm vertically and horizontally in position with respect to the bracket. The tabs are configured to extend laterally, orthogonal to the arm. The tabs 722 are spring-loaded by the leaf spring 712 and may be moved by pressing the leaf spring 712 or by pressing the spring-loaded tabs against the load of the spring. In some aspects, the spring-loaded tabs have a beveled surface to engage a surface of the prongs as the arm is pressed toward the prongs. As the beveled surfaces of the tabs slide over the prongs, the tabs are lifted and then snap into place between the prongs. The tabs releasably secure the arm against movement toward and away from the canister.

Figure 8:
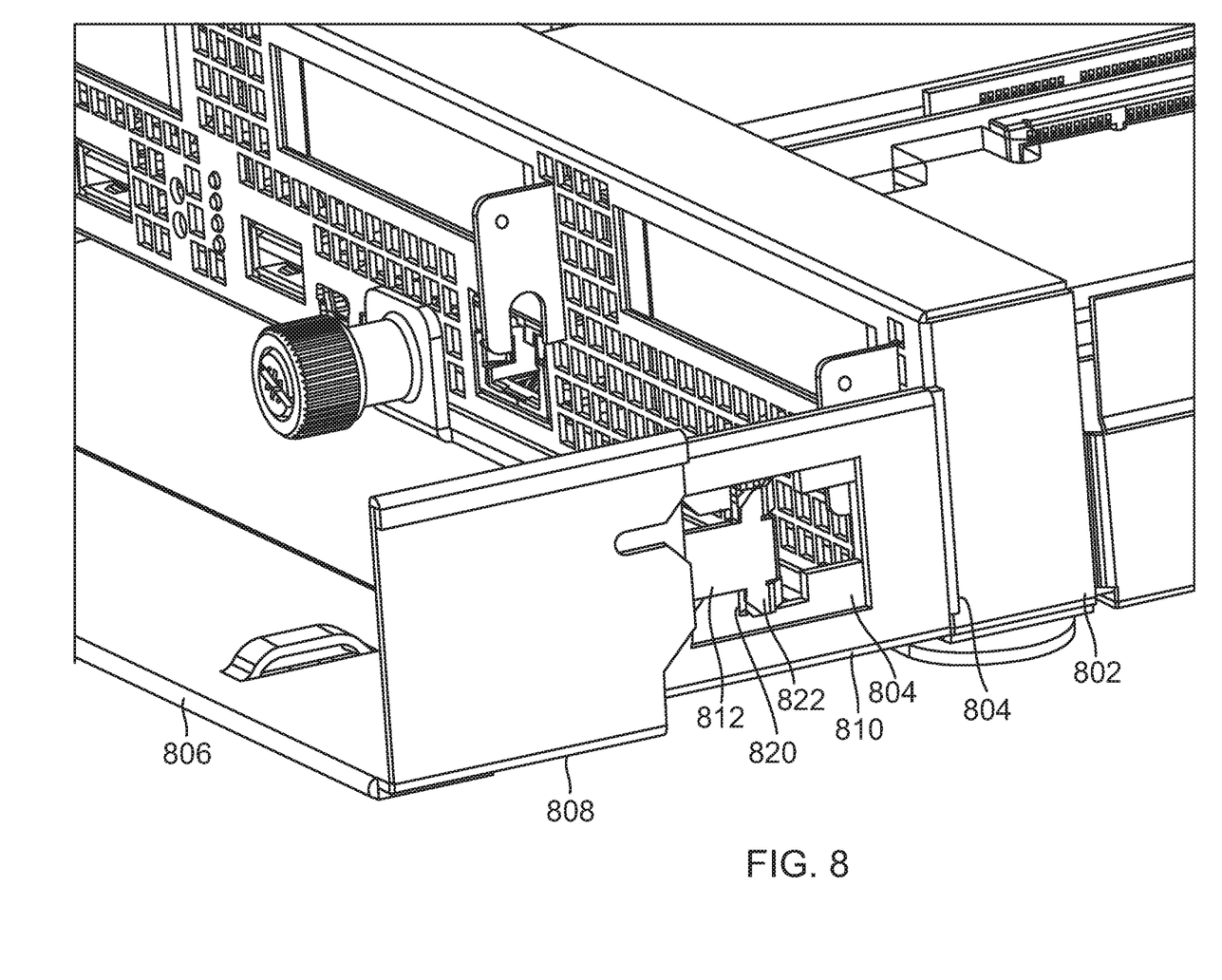
FIG. 8 is a rear isometric view of one side of the full width perch that is attached to an edge of a canister.

FIG. 8 is a rear isometric view of one side of the full width perch that is attached to an edge of a canister. The perch 806 has a side wall 808. An arm, that is fastened to the side wall 808, is secured to a bracket 804 that is secured to a canister 802. As shown, the guides 810 of the arm slide over the bracket 804 to secure the perch 806 in place. Tabs 822 engage prongs 820 of the bracket and are held in place by a leaf spring 812. The tabs are formed as an extension of the leaf spring. The prongs 820 are formed as protrusions from the bracket 804. The perch 806 may be attached to the bracket 804 by pressing the guides 810 over the bracket 804 toward the canister until the tabs 822 snap into place locking the tabs 822 against the prongs 820. The perch 806 may be removed by pressing the leaf spring 812 outward against the spring load to release and disengage the tabs 822 from the prongs 820 and then pulling the perch 806 away from the canister 802.

While the example is presented as brackets attached to a canister, the brackets may be attached directly to a component instead. The particular configuration of guides, tabs, springs, and prongs may be modified or substituted to suit different types of components, canisters, cables, and rack-mount scenarios.

Figure 9:
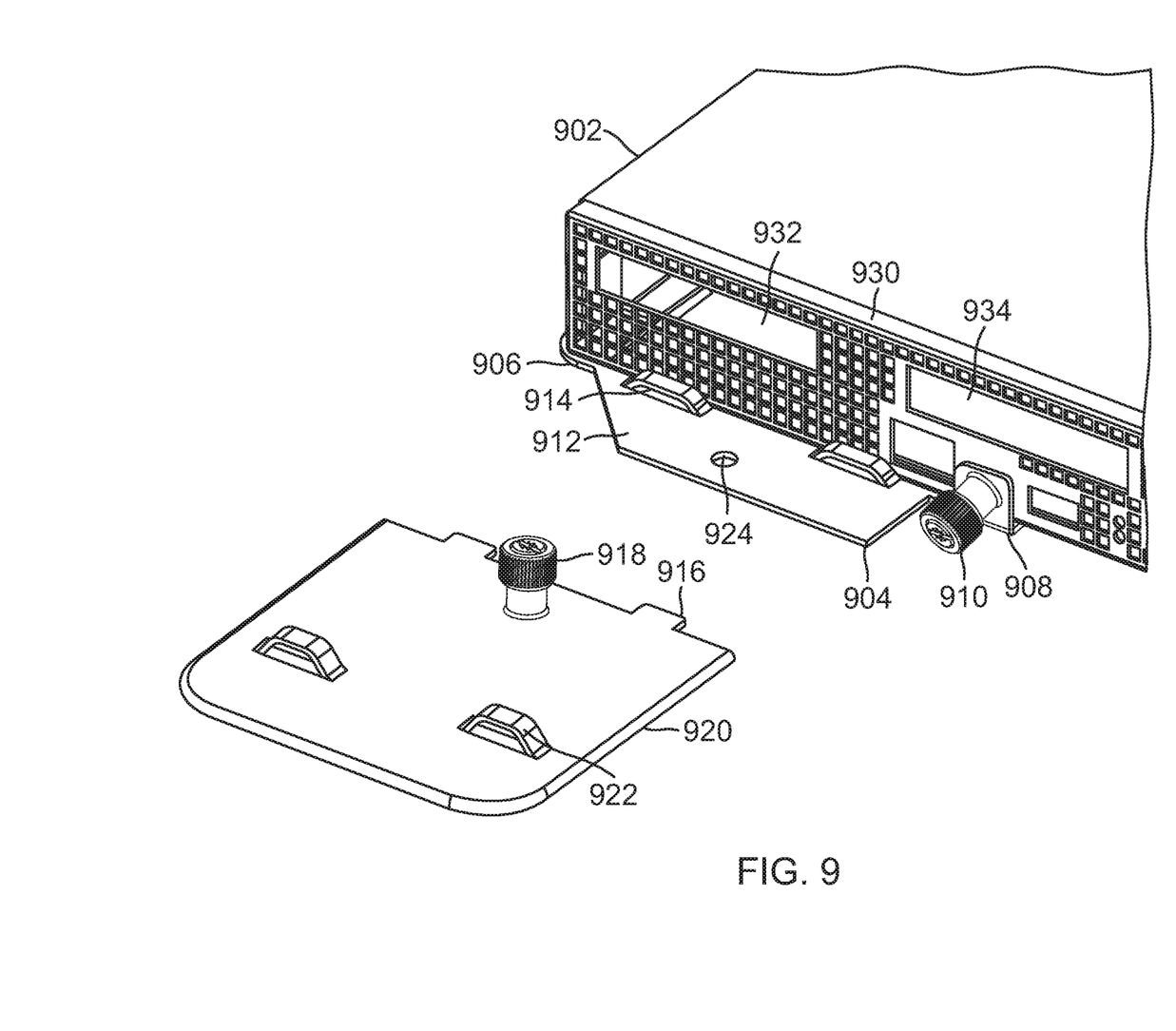
FIG. 9 is an exploded rear isometric view of a perch that supports an add-in card slot.

FIG. 9 is an exploded rear isometric view of a perch that supports an add-in card slot. The perch 920 may be any of the perches shown in FIGS. 3-6. The other perches shown herein may be adapted to be attached as shown. A component 930 has a first opening 932 and a second opening 934 to support add-in cards using add-in card slots, drive bays, I/O panels, or another feature. The component 930 is mounted to a canister 902 that provides for supporting the component and attaching the component 930 to a rack. The component may have additional features not shown here. A bracket 904 is attached to the canister 902 using a bottom mount 906 and a rear mount 908. The bottom mount is held to the canister with a bottom mount screw (not shown) and the rear mount 908 is held to the canister with a rear mount screw 910. The bracket 904 features a support plate 912 to support the perch 920 when the perch 920 is installed on the bracket 904. The support plate 912 has a threaded attachment hole 924 and two lances 914. The lances 914 are positioned near the component 930 with an opening facing outward away from the component 930.

The perch 920 has two protruding tabs 916 configured to engage the lances 914. The perch also has an attachment screw 918 configured to engage the threaded attachment hole 924 when the tabs 916 are inserted into the lances 914. The perch includes a bar having a width and an elongated surface configure to support any cables from the component 930 and any devices mounted in the openings 932, 934 such as add-in cards and I/O panels. The perch also has lances 922 to allow any cables to be secured to the perch. The screws, such as the rear mount screw 910 and the attachment screw 918 are configured with knurled ends to allow the screws to easily be turned by hand. The screw heads are also slotted to allow the use of a screwdriver. Either or both facilities may be used on any one of the screws discussed herein.

Figure 10:
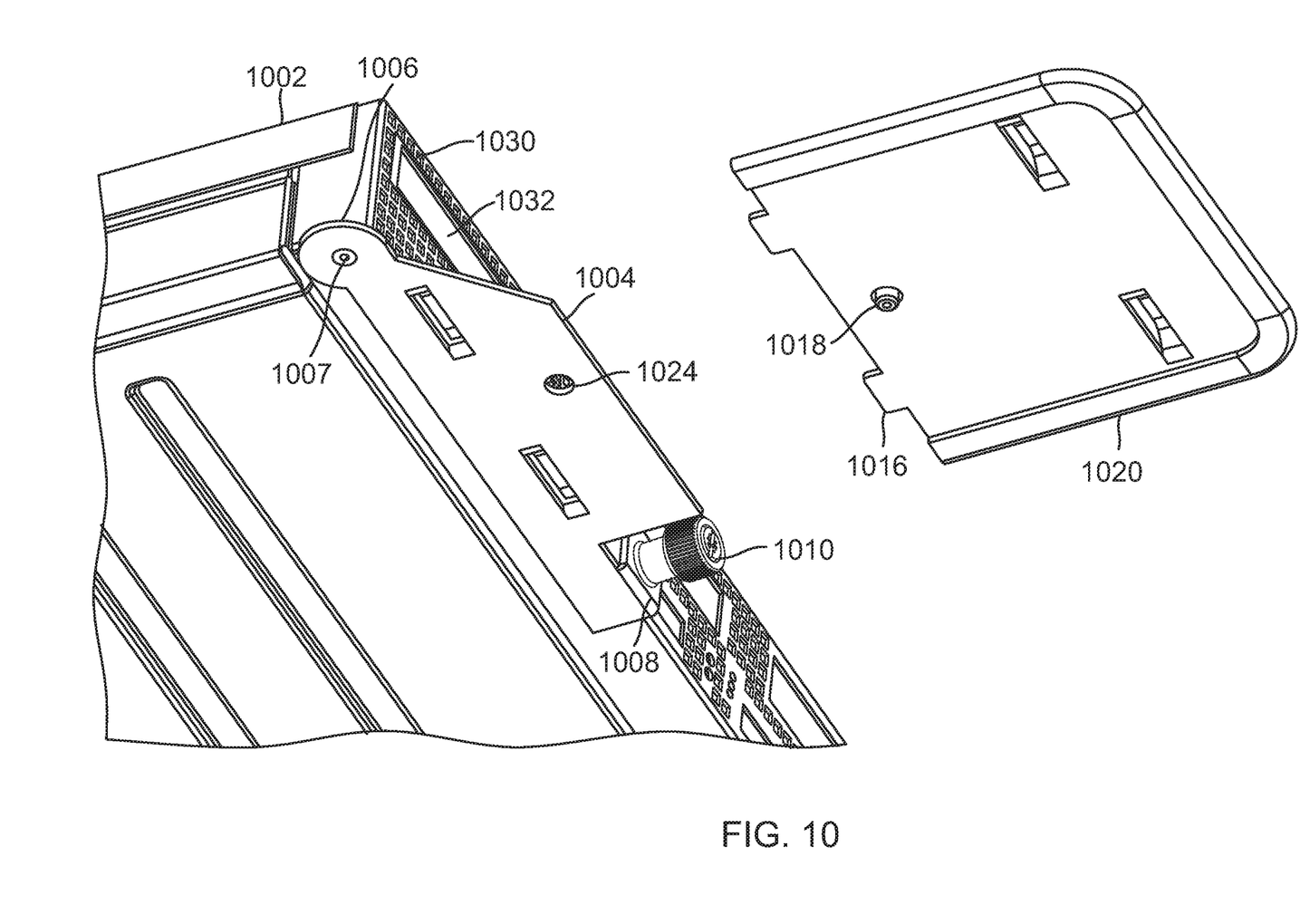
FIG. 10 is an exploded rear isometric view from below of the perch that supports an add-in card slot.

FIG. 10 is an exploded rear isometric view from below of the perch that supports an add-in card slot. A component 1030 with an opening 1032 for an add-in card slot or other device is attached to a canister 1002. A bracket 1004 is attached to the canister 1002. A bottom mount 1006 of the bracket 1004 is secured to the canister 1002 with a bottom mount screw 1007. A rear mount 1008 of the bracket 1004 is secured to the canister 1002 with a rear mount screw 1010. The bracket also has a threaded attachment hole 1024 to receive an attachment screw 1018 of a perch 1020. The perch 1020 has tabs 1016 to engage lances (not shown) of the bracket.

Figure 11:
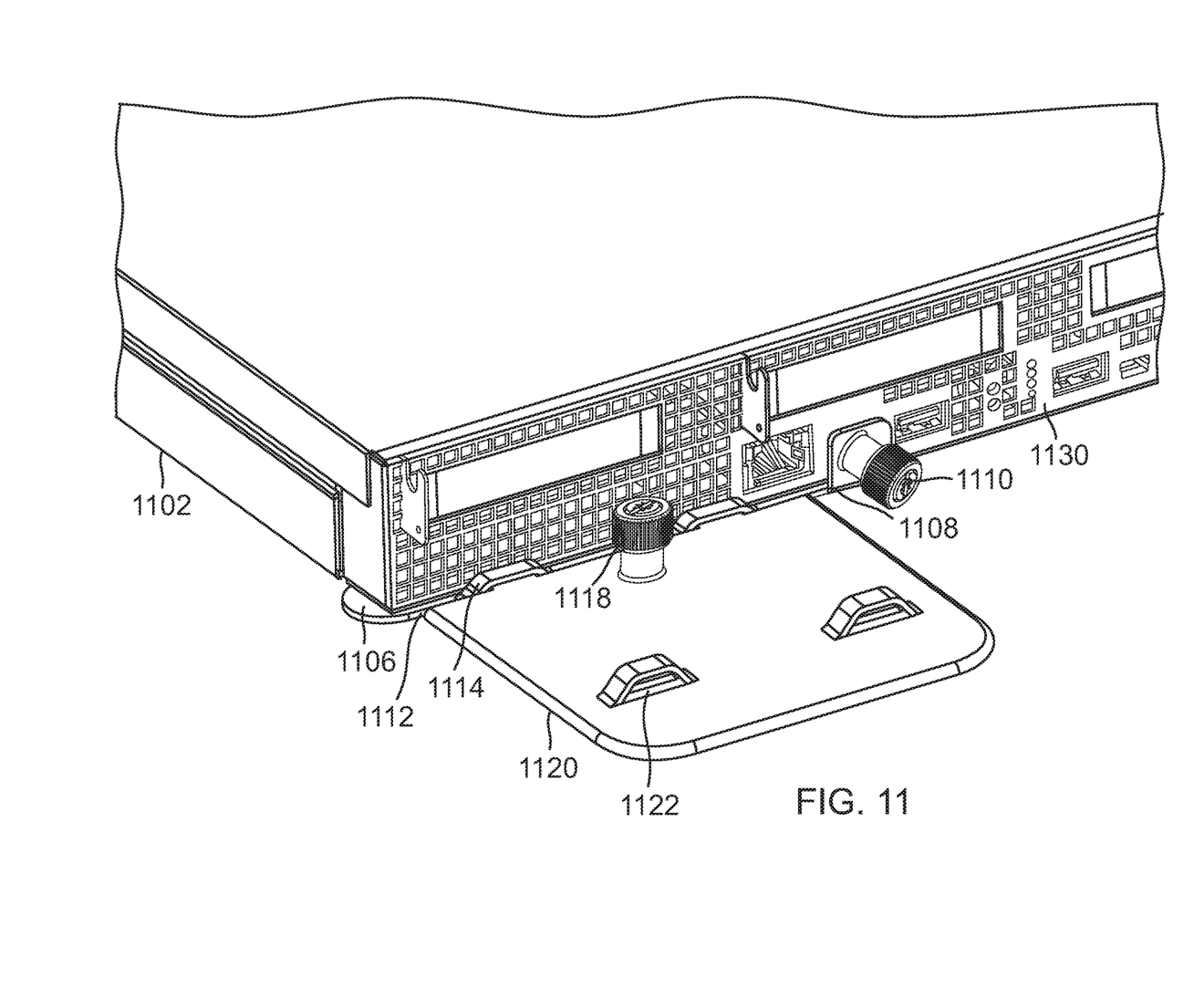
FIG. 11 is a rear isometric view of a perch attached to a canister.

FIG. 11 is a rear isometric view of a perch attached to a canister. The perch 1120 is secured to a bracket 1112 by an attachment screw 1118 and lances 1114. The perch also has a width and an elongated surface to support cables lying on the bar and other any other materials. The perch surface may include lances 1122 for use in securing items to the perch. The bracket 1112 is attached to a canister 1102 by a bottom mount 1106 and a rear mount 1108. The rear mount 1108 is attached to the canister with a rear mount screw 1110. The canister is attached to a component 1130 that may include add-in card slots and other cable connections. The perch 1120 may be modified to include side walls, a back wall, or both. Lances or other attachment devices may be added to suit different uses. The length and width of the perch may be modified to suit different uses and different types of components or cable connections.

As may be used herein, the term "operable to" or "configurable to" indicates that an element includes one or more of components, attachments, circuits, instructions, modules, data, input(s), output(s), etc., to perform one or more of the described or necessary corresponding functions and may further include inferred coupling to one or more other items to perform the described or necessary corresponding functions. As may also be used herein, the term(s) "coupled", "coupled to", "connected to" and/or "connecting" or "interconnecting" includes direct connection or link between nodes/devices and/or indirect connection between nodes/devices via an intervening item (e.g., an item includes, but is not limited to, a component, an element, a circuit, a module, a node, device, network element, etc.). As may further be used herein, inferred connections (i.e., where one element is connected to another element by inference) includes direct and indirect connection between two items in the same manner as "connected to". As may be used herein, the terms "substantially" and "approximately" provide an industry-accepted tolerance for its corresponding term and/or relativity between items.

The various features of the disclosure described herein can be implemented in different systems and devices without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the foregoing specification, certain representative aspects of the invention have been described with reference to specific examples. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described. For example, the components and/or elements recited in any apparatus claims may be assembled or otherwise operationally configured in a variety of permutations and are accordingly not limited to the specific configuration recited in the claims.

Furthermore, certain benefits, other advantages and solutions to problems have been described above with regard to particular embodiments; however, any benefit, advantage, solution to a problem, or any element that may cause any particular benefit, advantage, or solution to occur or to become more pronounced are not to be construed as critical, required, or essential features or components of any or all the claims.

As used herein, the terms "comprise," "comprises," "comprising," "having," "including," "includes" or any variation thereof, are intended to reference a nonexclusive inclusion, such that a process, method, article, composition or apparatus that comprises a list of elements does not include only those elements recited, but may also include other elements not expressly listed or inherent to such process, method, article, composition, or apparatus. Other combinations and/or modifications of the above-described structures, arrangements, applications, proportions, elements, materials, or components used in the practice of the present invention, in addition to those not specifically recited, may be varied or otherwise particularly adapted to specific environments, manufacturing specifications, design parameters, or other operating requirements without departing from the general principles of the same.

Moreover, reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is intended to be construed under the provisions of 35 U.S.C. § 112(f) as a "means-plus-function" type element, unless the element is expressly recited using the phrase "means for" or, in the case of a method claim, the element is recited using the phrase "step for."

What is claimed is:

1. A perch comprising:
   a bar having a width and an elongated surface, the elongated surface having two opposite ends; and
   an arm attached to the bar at each end of the bar, the arms being configured to attach to a rack-mount component so that the bar extends horizontally across a portion of the component with a gap between the bar and a closest face of the component;
   wherein the arm is configured to attach to a bracket attached to the component; and
   wherein the arm further comprises spring-loaded tabs to releasably secure the arm against the bracket.

2. The perch of claim 1, further comprising a side wall at each end of the bar substantially orthogonal to the bar, wherein the arms each attach to a respective side wall.

3. The perch of claim 2, wherein the side wall is formed as a bend in the bar.

4. The perch of claim 1, wherein the bracket is attached to the component by being attached to a canister that is attached to the component.

5. The perch of claim 1, wherein the arm further comprises guides configured to slide onto the bracket to secure the arm with respect to the bracket.

6. The perch of claim 1, wherein the bar elongated surface is substantially flat and configured to support cables lying on the bar.

7. The perch of claim 1, further comprising a cable lance formed in the bar.

8. The perch of claim 1, further comprising a cable lance attached to the bar.

9. The perch of claim 1, further comprising an end wall attached to the bar at an angle to the bar, the end wall configured to contain a cable between the end wall and the component.

10. The perch of claim 1, further comprising a cable lance formed in an end wall.

11. The perch of claim 1, wherein the width of the bar is less than half the width of the component.

12. A perch comprising:
 a bracket configured to be attached to a rack-mount component;
 a bar having a width and an elongated surface, the bar having tabs configured to engage with the bracket; and
 an attachment screw to secure the bar to the bracket so that the bar extends horizontally across a portion of the component;
 wherein the bracket comprises cable lances to receive the tabs and a support plate to support the perch when the perch is installed on the bracket.

13. The perch of claim 12, wherein the bracket has a first bottom mount configured to be held to a canister with a bottom mount screw and a rear mount configured to be held to the canister with a rear mount screw.

14. The perch of claim 12, wherein the bar elongated surface is substantially flat and configured to support cables lying on the bar.

15. The perch of claim 12, further comprising a cable lance formed in the bar.

16. The perch of claim 12, further comprising a cable lance attached to the bar.

17. The perch of claim 12, further comprising an end wall attached to the bar at an angle to the bar, the end wall configured to contain a cable between the end wall and the component.

18. The perch of claim 17, further comprising a cable lance formed in the end wall.

19. The perch of claim 12, wherein the width of the bar is less than half the width of the component.

20. A perch comprising:
 a bracket configured to be attached to a rack-mount component;
 a bar having a width and an elongated surface, the bar having tabs configured to engage with the bracket; and
 an attachment screw to secure the bar to the bracket so that the bar extends horizontally across a portion of the component;
 wherein the bracket has a first bottom mount configured to be held to a canister with a bottom mount screw and a rear mount configured to be held to the canister with a rear mount screw.

21. The perch of claim 20, wherein the width of the bar is less than half the width of the canister.

22. The perch of claim 20, wherein the bar elongated surface is configured to support cables lying on the bar.

* * * * *